United States Patent [19]

Thompson et al.

[11] Patent Number: 5,206,796
[45] Date of Patent: Apr. 27, 1993

[54] ELECTRONIC INSTRUMENT WITH EMI/ESD SHIELDING SYSTEM

[75] Inventors: Bradley H. Thompson, Lynnwood; Brian S. Aikins, Everett; Roger M. Trana, Bothell, all of Wash.

[73] Assignee: John Fluke Mfg. Co. Inc., Everett, Wash.

[21] Appl. No.: 667,432

[22] Filed: Mar. 11, 1991

[51] Int. Cl.$^5$ .............................................. H05K 9/00
[52] U.S. Cl. ................................. 361/424; 174/35 R; 174/51; 361/399
[58] Field of Search .......... 174/35 R, 35 GC, 35 TS, 174/51; 357/80; 361/391, 392, 394, 395, 397, 399, 424; 439/108, 109, 607, 609

[56] References Cited

U.S. PATENT DOCUMENTS

| | | | |
|---|---|---|---|
| 4,384,165 | 5/1983 | Loving, Jr. et al. | 174/35 GC |
| 4,384,368 | 5/1983 | Rosenfeldt et al. | 361/394 |
| 4,399,487 | 8/1983 | Neumann | 361/399 |
| 4,567,318 | 1/1986 | Shu | 174/35 GC |
| 4,717,989 | 1/1988 | DeBarros et al. | 361/424 |
| 5,001,298 | 3/1991 | Jong | 174/35 R |
| 5,014,160 | 5/1991 | McCoy, Jr. | 361/424 |
| 5,032,689 | 7/1991 | Halligan et al. | 174/35 R |
| 5,045,971 | 9/1991 | Ono et al. | 361/424 |
| 5,053,924 | 10/1991 | Kurgan | 361/424 |

*Primary Examiner*—Leo P. Picard
*Assistant Examiner*—D. Sparks
*Attorney, Agent, or Firm*—John Smith-Hill; John P. Dellett

[57] ABSTRACT

An electronic instrument is provided with a shielding system consisting of two metallic shields press fitted into plastic instrument case parts without the need for any additional parts to provide electrical and mechanical attachment. In one embodiment, a bottom shield is press fitted onto protuberances inside of a lower case part and electrically connected to a common jack base on a circuit board within the instrument by a vee spring on the bottom shield. A top shield is press fitted into a capturing region of a switch support case part and includes an extension arm and extension ring that is mechanically held by case screws and guides already required by the plastic case. In that position, the extension ring is held in electrical contact with a common pad on the circuit board, the common pad being in electrical contact with a common trace, a common area, and the common jack base.

9 Claims, 3 Drawing Sheets

TO FIG.1B

ELECTRONIC INSTRUMENT WITH EMI/ESD SHIELDING SYSTEM

BACKGROUND OF THE INVENTION

This invention relates to shielding an electrical instrument against electromagnetic interference (EMI), including radio frequency interference (RFI), and electrostatic discharge (ESD), and more particularly to a system of such shielding that minimizes the number of components and their cost while maximizing ease of assembly.

The mass production of low cost instruments at a reasonable profit margin requires a design that permits assembly with a minimum of labor input per unit, a minimum number of parts and a minimum cost for those parts.

In product designs optimized for manufacturability, especially highly automated methods of manufacture, a concept known as "Z-axis assembly" is proving to be very important. Z-axis assembly simply means that a product is assembled by lowering the parts from above onto an existing subassembly. This is especially important in robotic assembly, but many of the same benefits can also be realized even in manual assembly. If automated assembly is being employed, the simplest and most cost effective parts handlers and other robotic machines can be employed to stack and connect parts to an existing sub-assembly quickly and easily if the product has been designed for Z-axis assembly.

Prior art shielding schemes have included electrically conductive plastic housings or separate metal layers connected to the instrument's common (ground) electrical plane. Electrically conductive plastics are expensive and do not provide very effective shielding because they do not really conduct very well. Separate metal layers require some means of both electrical and mechanical attachment. This has traditionally meant the use of additional parts, such as screws or springs, to accomplish that attachment.

What is desired is an adequate EMI, RFI and ESD shielding structure that utilizes a minimum number of inexpensive parts and is compatible with Z-axis insertion techniques.

SUMMARY OF THE INVENTION

In accordance with the invention, there is provided for an electronic instrument a shielding structure consisting of two metallic shields press fitted into plastic instrument case parts without the need for any additional parts to provide electrical and mechanical attachment. In one embodiment, a bottom shield is press fitted onto protuberances inside of a lower case part and electrically connected to a common jack base on a circuit board within the instrument by a vee spring on the bottom shield. A top shield is press fitted into a capturing region of a switch support case part and includes an extension arm and an extension ring that is mechanically held by case screws and guides already required by the plastic case. In that position, the extension ring is held in electrical contact with a common pad on the circuit board, the common pad being in electrical contact with a common trace, a common area, and the common jack base.

The subject matter of the present invention is particularly pointed out and distinctly claimed in the concluding portion of this specification. However, both the organization and method of operation, together with further advantages and objects thereof, may best be understood by reference to the following detailed description and accompanying drawings.

DETAILED DESCRIPTION

Figure 1A:
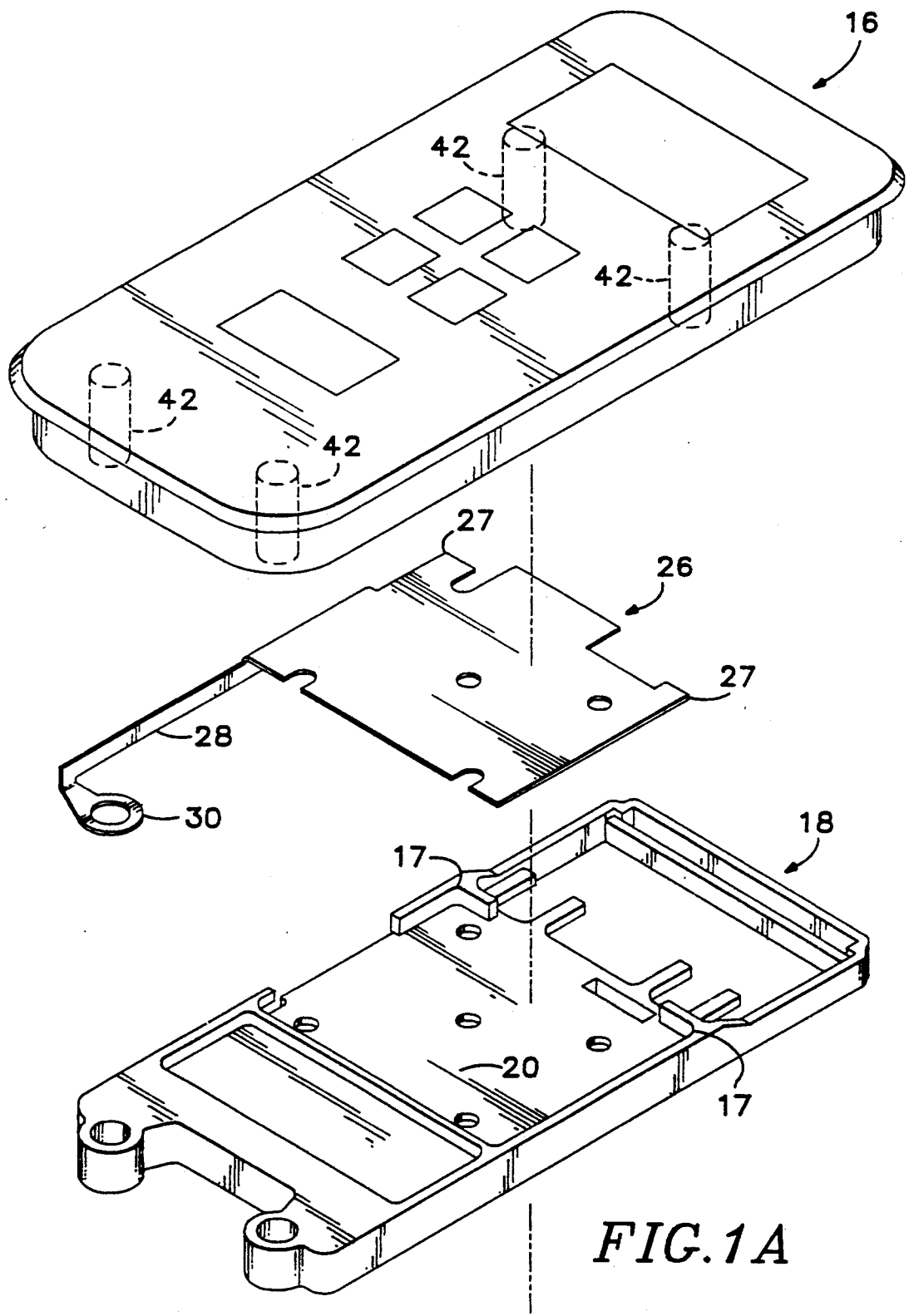
FIGS. 1A and 1B together illustrate an exploded view of a small, hand-held electronic instrument according to the present invention.
Figure 1B:
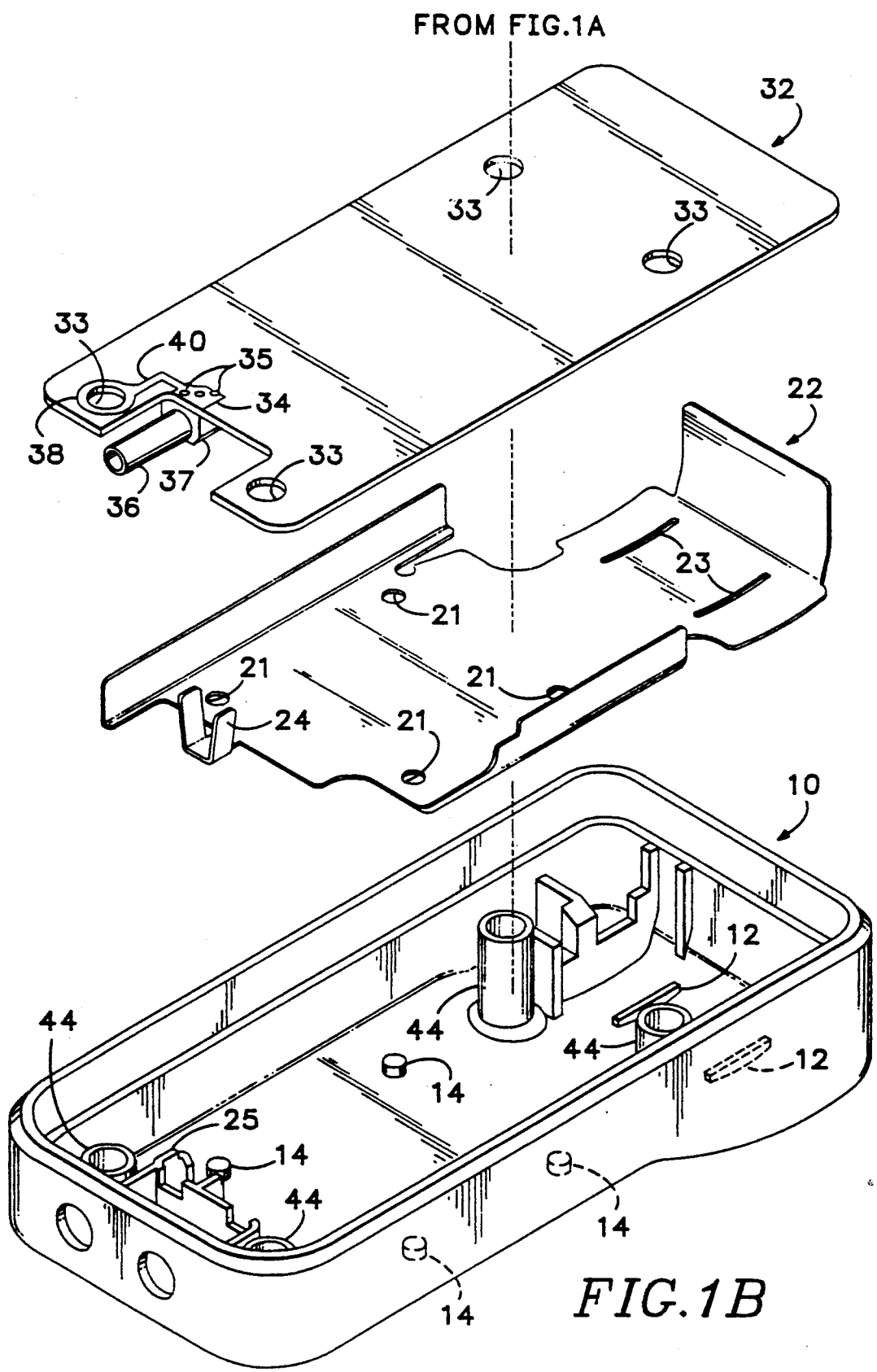

Referring to FIG. 1, a small, hand-held electronic instrument includes an instrument shielding system according to the present invention. Lower case part 10, switch support case part 18 and upper case part 16 are made of plastic, such as electrically insulating and flame retardant acrylonitrile butadiene styrene (ABS) sold under the designation Cycolac (TM) KJW by GE (General Electric) Plastics. The lower case part 10 and upper case part 16 house, among other things, a circuit board 32.

Circuit board 32 has as part of its printed wiring a common (ground) area 34 that is electronically and mechanically connected to a common (ground) jack 36 on the other side of the circuit board 32 by common pins 35 and common jack base 37. A common pad 38 is connected to the common area 34 by a common trace 40.

The lower case part 10 and upper case part 16 also house, above the circuit board 32, the switch support case part 18. To electrically shield the circuit board 32 from EMI and ESD, the lower case part 10 and the switch support case part 18 are equipped, respectively, with bottom shield 22 and top shield 26. The shields 22 and 26 are preferably stamped from a light springy yet ductile metal, such as full hard temper H18 aluminum that is 0.012 inches (0.305 mm) thick.

The bottom shield 22 is provided with slots 23 and circular holes 21, while the lower case part 10 is provided at corresponding locations with longitudinal protuberances 12 and round protuberances 14. The holes 21 have a diameter that is only 9/10 as large as the diameter of the round protuberances 14, and the slots 23 have a width that is only 9/10 of the width of the longitudinal protuberances 12. The bottom shield 22 is sufficiently thin such that when it is press fitted into the lower case part 10, the metal of the bottom shield 22 is deflected upward around the round protuberances 14 and along the sides of the longitudinal protuberances 12 of the lower case part 10. The pressure of the deformation and springiness of the full hard temper (H18) aluminum make the sharp edges around the slots 23 and holes 21 dig into the plastic of the protuberances 12 and 14, ensuring that the bottom shield 22 does not come loose, even through extreme vibration and drop testing.

Figure 2:
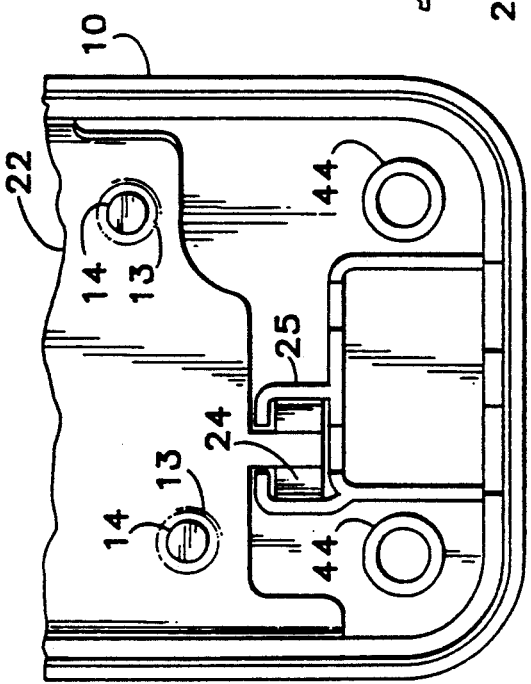
FIG. 2 is a partial view of a bottom shield press fitted into a lower case part.

FIG. 2 shows a portion of the bottom shield 22 press fitted into place within the lower case part 10. Deformed areas 13 surround the round protuberances 14.

A vee spring 24 rests within a spring retainer 25 that is part of the lower case part 10.

Figure 4:
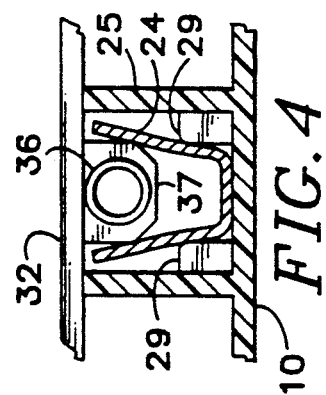
FIG. 4 is a cross-sectional view taken along the line IV—IV of FIG. 3.
Figure 3:
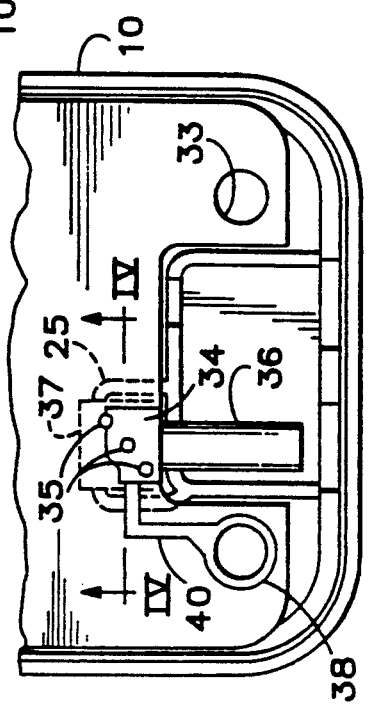
FIG. 3 is a partial view of a circuit board disposed within the lower case part.

Referring now to FIG. 3 and to FIG. 4, which is a cross-sectional view along IV—IV in FIG. 3, it can be seen that when the circuit board 32 is placed in its proper position within the lower case part 10, the common jack base 37 rests within the vee spring 24. And, as can be seen in FIG. 4, the beveled sides of the common jack base 37 make contact with the vee spring 24 along the upper edge of the bevels, while the bottom portions of the vee spring 24 are constrained in their ability to separate by the presence of spring impeding members 29. This provides an effective and self-cleaning electrical contact between the bottom shield 22 and the common plane of the electronic instrument.

Figure 5:
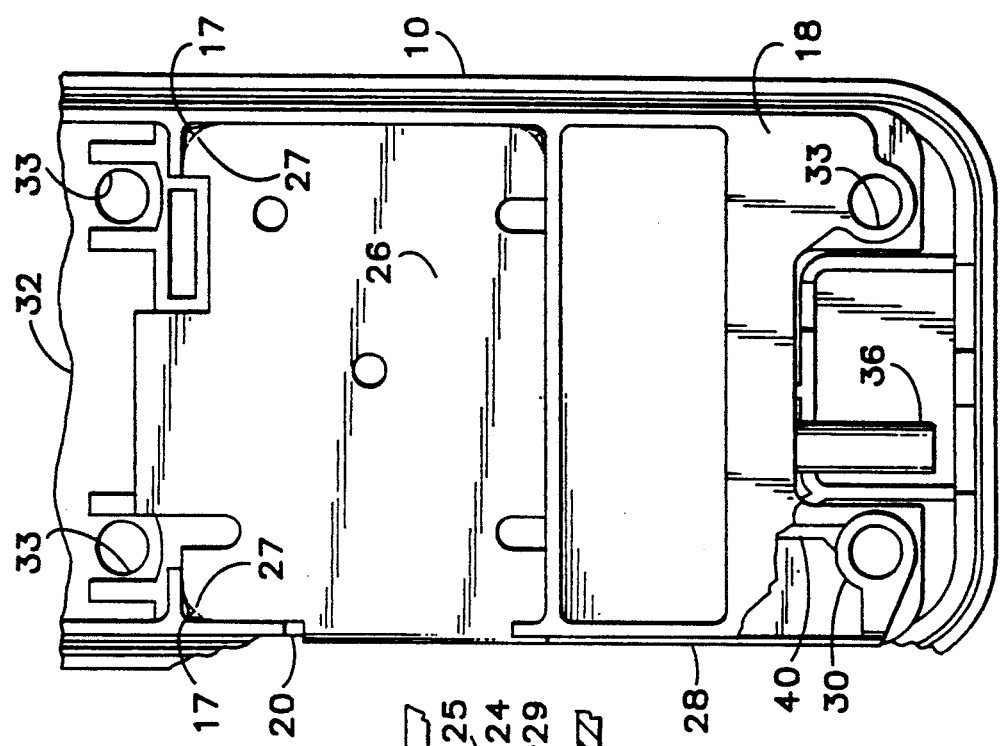
FIG. 5 is a view of the top shield press fitted into a capturing region of a switch support case part, the partially cut-away switch support case part being seated inside the lower case part.

The next step in the assembly process requires some departure from Z-axis assembly methods, but provides a sub-assembly that can then be assembled with the circuit board 32 and lower case part 10 using Z-axis techniques. The top shield 26 is placed on the top of the switch support case part 18 as shown in FIGS. 1A and 5. An extension arm 28 provides electrical and mechanical connection and support between the main portion of the top shield 26 and an extension ring 30. When top shield 26 is placed in its proper position on top of the switch support case part 18, the extension arm 28 wraps around the side of the switch support case part and presents the extension ring 30 to the bottom side of the switch support case part 18. Note that part of the switch support case part 18 is shown cutaway in the lower left part of FIG. 5 to reveal how the extension ring 30 matches up with the location of the common pad 38 (not visible) on the circuit board 32.

The top shield is then press fitted into a capturing region 20 of the switch support case part 18. The dimensions of the top shield 26 are very slightly smaller than those of capturing region 20, except that the capturing region 20 has rounded corners 17, while the top shield 26 has square corners 27. This creates about 0.015 to 0.020 inches (0.38 to 0.51 mm) of interference as the two parts are press fitted together. Press fitting the aluminum top shield 26 into the capturing region 20 to overcome this interference produces a slight deformation that serves to hold the two parts together. This press fit is not as tight as that between the bottom shield 22 and the protuberances 21 and 23 on the lower case part 10, and is reversible without damage to either part. The subassembly that results from this operation is then available for use in assembling the overall instrument.

After the switch support case part 18 and top shield 26 sub-assembly are placed on top of the circuit board 32 in the main sub-assembly that includes the lower case part 10 fitted with the bottom shield 22, a keypad is placed on top of the top shield 26 and secured there by the upper case part 16 when the complete instrument assembly is screwed together.

The extension ring 30 is then secured to the common pad 38 when case screws (not shown) passing through case screw guides 44 draw the whole assembly tightly together as they enter screw receiving posts 42. The screw receiving posts 42 pass through the receiving post passages 33 in the circuit board 32 and the common pad 38, ensuring that there can be no arcing over to the metal screws if a high voltage is inadvertently applied to the instrument's common jack 36. Thus, the press fitting together of the switch support case part 18 and the top shield 26 is a temporary convenience that aids in the handling of the sub-assembly during the manufacturing process. The final electrical and physical sturdiness of the way that the top shield 26 connects to the rest of the instrument is supplied by the overall structure of the instrument, rather than by the press fit in this case.

This instrument design, including the shielding system according to the present invention, provides the structural integrity to retain its electrical contact, and consequently its shielding properties, even when subjected to dropping from a height of two meters. It is also compatible with the "Z-axis insertion" concept.

In order to keep the foregoing discussion straightforward, the parts of this electronic instrument have been described in terms of a bottom-to-top assembly process. In a preferred embodiment, the actual assembly process is upside down and top-to-bottom.

The electrical connection between the bottom shield 22 and the common jack base 37 has been shown as provided by vee spring 24. A variety of other spring types integral to the bottom shield, such as leaf or C springs, could be used instead. However, the vee spring described seems to be particularly effective in responding to routine vibration by creating a wiping motion on the contact areas that keeps them free of oxidation and corrosion that might otherwise degrade the quality of the electrical contact.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true scope of the invention.

We claim:

1. An electronic instrument comprising:
   an instrument case including a first case part and a second case part,
   a circuit board disposed in the instrument case, the circuit board embodying electronic circuitry that includes a common (ground) region comprising a common area on the circuit board and a common jack connected to the common area,
   a first metallic shield part press fitted to the first case part and comprising a vee spring that contacts the common jack to provide electrical contact with the common region of the electronic circuitry, and
   a second metallic shield part press fitted to the second case part and having a contact portion in electrical contact with the common region.

2. An electronic instrument according to claim 1, wherein the instrument case includes protuberances and the first metallic shield part defines apertures corresponding in location to the protuberances and having a dimension that is smaller than the corresponding dimension of the corresponding protuberance.

3. An electronic instrument according to claim 1, wherein the instrument case includes a capturing region and the second metallic shield part includes a corresponding region, the corresponding region having a side having a dimension that is slightly smaller than the dimension of the corresponding side of the capturing region.

4. An electronic instrument according to claim 3, wherein the capturing region has rounded corners while the second metallic shield part has corresponding corners that are square.

5. An electronic instrument according to claim 1, wherein the second metallic shield part comprises a major shield portion, and extension arm extending from said major shield portion, and an extension ring at an end of the extension arm that is distal form the major shield portion, the extension ring contacting the common ring of the common region of the electronic circuitry.

6. An electronic instrument comprising:
   an instrument case including a first case part and a second case part,
   a circuit board disposed in the instrument case, the circuit board embodying electronic circuitry that includes a common (ground) region comprising a common area on the circuit board, a common trace connected t the common area, and a common ring connected to the common trace,
   a first metallic shield part press fitted to the first case part and having a contact point in electrical contact with the common region, and
   a second metallic shield part press fitted to the second case part and having a contact point in electrical contact with the common region, and wherein the second metallic shield part comprises a major shield portion, an extension arm extending from said major shield portion, and an extension ring at an end of the extension arm that is distal from the major shield portion, the extension ring contacting the common ring of the common region of the electronic circuitry.

7. An electronic instrument according to claim 6, wherein the instrument case includes protuberances and the first metallic shield part defines apertures corresponding in location to the protuberances and having a dimension that is smaller than the corresponding dimension of the corresponding protuberance.

8. An electronic instrument according to claim 6, wherein the instrument case includes a capturing region and the second metallic shield part includes a corresponding region, the corresponding region having a side having a dimension that is slightly smaller than a dimension of the corresponding side of the capturing region.

9. An electronic instrument according to claim 8, wherein the capturing region has rounded corners while the second metallic shield part has corresponding corners that are square.

* * * * *

UNITED STATES PATENT AND TRADEMARK OFFICE
CERTIFICATE OF CORRECTION

PATENT NO. : 5,206,796
DATED : April 27, 1993
INVENTOR(S) : Bradley H. Thompson et al It is certified that error appears in the above-identified patent and that said Letters Patent is hereby corrected as shown below:

On the cover page, item [75] Inventors:
     Add --Yoshio Shimono, Mukilteo, Wash.--.

Column 2, line 33, "electronically" should read
     --electrically--.

Column 5, line 3, "form" should read --from--.

Column 5, line 14, "t" should read --to--.

Column 5, line 17, "point" should read --portion--.

Column 5, line 20, "point" should read --portion--.

Signed and Sealed this

Eleventh Day of January, 1994

*Attest:*

BRUCE LEHMAN

*Attesting Officer*    *Commissioner of Patents and Trademarks*